United States Patent
Sze

(10) Patent No.: US 6,291,330 B1
(45) Date of Patent: Sep. 18, 2001

(54) METHOD OF FABRICATING GATE STRUCTURE TO REDUCE STRESS PRODUCTION

(75) Inventor: Jhy-Jyi Sze, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/494,521

(22) Filed: Jan. 31, 2000

(51) Int. Cl.[7] ............. H01L 21/3205; H01L 21/4763; H01L 21/336
(52) U.S. Cl. ............. 438/585; 438/298; 438/589; 438/595
(58) Field of Search .................. 438/298, 585, 438/589, 595

(56) References Cited

U.S. PATENT DOCUMENTS

| | | | |
|---|---|---|---|
| 5,688,704 | * 11/1997 | Liu | 437/41 |
| 5,786,255 | * 7/1998 | Yeh et al. | 438/299 |
| 5,851,876 | * 12/1998 | Jenq | 438/253 |
| 5,915,181 | * 6/1999 | Tseng | 438/289 |
| 6,090,676 | * 7/2000 | Gardner et al. | 438/303 |
| 6,107,140 | * 8/2000 | Lee et al. | 438/259 |

* cited by examiner

Primary Examiner—Matthew Smith
Assistant Examiner—Lex H. Malsawma
(74) Attorney, Agent, or Firm—Jiawei Huang; J.C. Patents

(57) ABSTRACT

A fabrication method for a gate structure formed on a substrate, which has isolation structures formed therein. A buffer oxide layer is formed, followed by forming a patterned nitride layer and a patterned mask layer. The patterned nitride layer and the patterned mask layer defines a gate opening for forming a gate stack comprising a gate oxide layer, a doped polysilicon layer, a metal silicide layer, and a cap layer. Consequently, a source/drain region is formed through performing a LDD implantation, while a spacer is formed on a sidewall of the gate stack to complete the manufacture of a gate structure.

27 Claims, 4 Drawing Sheets

METHOD OF FABRICATING GATE STRUCTURE TO REDUCE STRESS PRODUCTION

BACKGROUND OF THE INVENTION

1. Field of Invention

The present invention relates to a method of fabricating a semiconductor device. More particularly, the present invention relates to a fabrication method of a gate structure so as to reduce stress production.

2. Description of Related Art

In a high integration semiconductor process, a metal oxide semiconductor transistor, known as MOS transistor in short, has been adopted to replace the role played by the conventional bipolar transistor in conducting current in the semiconductor device. The MOS transistor generally comprises of a gate structure to which the input signal is normally applied, and a source/drain region, across which the output voltage is developed, and through which the output current flows.

A conventional fabrication process for the gate structure includes forming a gate oxide layer on an active region of a substrate defined by isolation structures. A gate stack comprising of a polysilicon layer, a metal silicide layer, and a nitride layer was hen formed on the gate oxide layer. The process continued by forming a buffer oxide layer on sidewalls of the gate stack, and forming a nitride spacer on sidewalls of the buffer oxide layer. FIGS. 1A through 1E illustrate the conventional fabrication process for the gate structure and some problems created when the buffer oxide layer was formed using different oxidation methods.

Referring to FIG. 1A, a substrate 100 is provided with an active region (not shown) defined by isolation structures 102 in the substrate 100. A gate oxide layer 104 is then grown on the substrate 100, followed by formation of a gate stack 111. The gate stack 111 comprises of a doped polysilicon layer 106 to provide an electrical conduction, a metal silicide layer 108 to enhance a transmission speed, and a nitride layer 110 for passivation. The method for forming the gate stack 111 includes depositing in sequence the doped polysilicon layer 106, the metal silicide layer 108, and the nitride layer 110 on the gate oxide layer 104, followed by patterning the three layers to obtain the gate stack 111 on the active region.

Referring to FIG. 1B, a buffer oxide layer 112a is formed to cover the gate stack 111 and the gate oxide layer 104. The buffer oxide layer 112a is known to reduce a stress induced by a nitride spacer (not shown), and one common approach for forming the buffer oxide layer 112a includes low-pressure chemical vapor deposition (LPCVD).

Referring to FIG. 1C, another nitride layer (not shown) for forming a nitride spacer 114 is formed on the buffer oxide layer 112a. The nitride spacer 114 is formed using an etch-back process to remove the excess nitride layer. An etch-back process is further performed to remove the excess buffer oxide layer 112a on the nitride layer 110. A lightly doped drain (LDD) implantation is performed to dope ions into the substrate 100 for forming a source/drain region 116. However, the buffer oxide layer 112a formed as such creates a buffer oxide breakthrough problem when a self-aligned contact (SAC) opening is subsequently formed by etching. After forming a silicon oxide layer 118 for insulation, a large portion the buffer oxide layer 112a is also removed together with a part of the silicon oxide layer 118, as shown in FIG. 1C. This creates a notch that exposes the conductive material in the gate stack to a metal layer deposited in the subsequent process. As a result, an electrical problem, such as short circuit occurs in the fabrication process.

The process step described in FIG. 1C is different from FIG. 1D and FIG. 1E only in terms of the oxidation approach for forming the buffer oxide layer, therefore similar process steps will not be described further herein. Referring to FIG. 1D, the buffer oxide layer 112b is formed on the gate oxide layer 104 and sidewalls of the metal silicide layer 108 and the polysilicon layer 106. The buffer oxide layer 112b is formed by rapid thermal oxidation (RTO), so that the buffer oxide layer 112b formed on the gate oxide layer 104 is thicker than the buffer oxide layer 112b formed on the sidewalls of the metal silicide layer 108 and the polysilicon layer 106. However, the buffer oxide layer 112b formed by RTO usually requires conditions, such as high temperature and short duration, which conditions would produce a stress that degrades the gate oxide layer. And besides the problem of gate oxide degradation, the fabrication process that includes RTO also incurs a high thermal budget. FIG. 1E, illustrates another approach for forming the buffer oxide layer 112c, where the buffer oxide layer 112c is grown by thin oxidation in a furnace (not shown). This method of oxidation inevitably creates problems such as oxide encroachment, where a part of buffer oxide layer 112c grows into the polysilicon layer 106 to damage the gate stack 111. According to this oxidation, the buffer oxide layer 112c grown on the sidewall of the gate stack 111 is thicker. As a result, this reduces the critical dimension (CD) and deteriorates the refresh time of the semiconductor device.

SUMMARY OF THE INVENTION

The invention provides a method of fabricating a gate structure, which method reduces stress production induced by a nitride spacer.

As embodied and broadly described herein, the invention provides a fabrication method for the gate structure. A substrate is provided with isolation structures formed therein, wherein the isolation structure defines an active region in the substrate. A buffer oxide layer is formed on the substrate, followed by forming a nitride layer and mask oxide layer. The nitride layer and the mask oxide layer are then patterned to form a gate opening, wherein the gate opening delineates a gate stack, which is formed within the gate opening. A part of the buffer oxide layer exposed by the gate opening is removed, followed by forming a gate oxide layer. A polysilicon layer, a metal silicide layer, and a cap nitride layer are formed in sequence as the gate stack on the gate oxide layer. The mask layer is removed prior to a lightly doped drain (LDD) implantation that is performed to form a source/drain region. A nitride spacer is then formed on sidewall of the gate stack to complete the manufacture of the gate structure.

According to the present invention, the gate stack is formed after formation of the buffer oxide layer, therefore problems resulted from formation of the buffer oxide layer by different oxidation approaches are solved. Specifically, the present invention has advantages and benefits such as, low thermal budget for device implant, since it is not necessary to perform rapid thermal oxidation to grow buffer oxide layer on the gate stack. The invention is also free from sidewall oxidation issue because the gate stack is formed after the formation of the buffer oxide layer, so problems such as oxide encroachment, CD shrinkage, and refresh time deterioration no longer occur. In addition, the invention solves the problem of buffer oxide breakthrough during the etching step for forming a self-aligned contact (SAC) opening.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1C, FIG. 1D, and FIG. 1E show buffer oxide layers formed by different oxidation approaches and problems created in each cases.

DESCRIPTION OF THE PREFERRED EMBODIMENTS

Description of the invention is made with reference to FIGS. 2A through 2F, which illustrate a fabrication process for a gate structure.

Figure 1A:
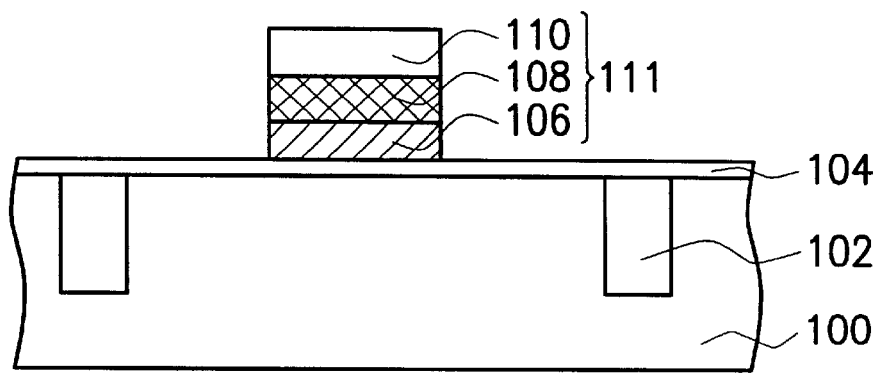
FIGS. 1A through 1E are schematic, cross-sectional diagrams illustrating a conventional process for fabricating a gate structure, particularly
Figure 1B:
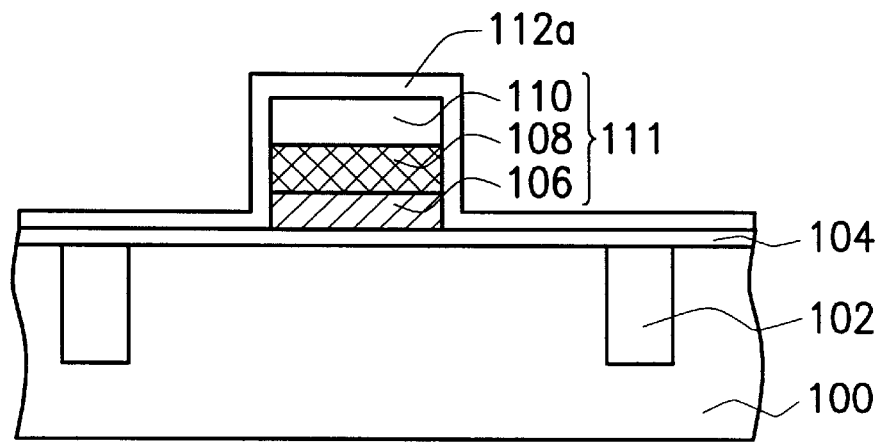
Figure 1C:
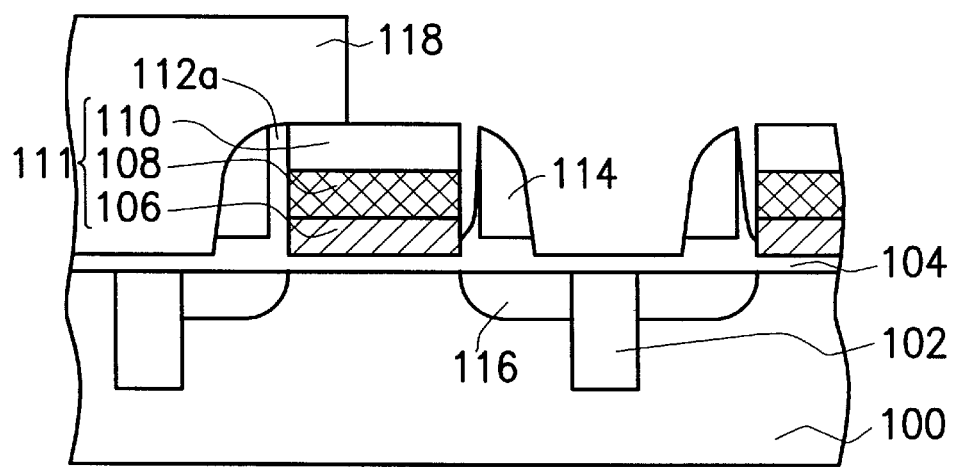
Figure 1D:
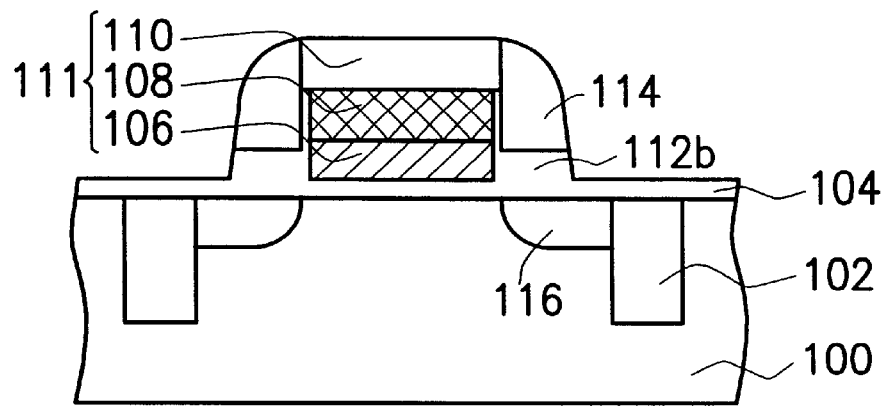
Figure 1E:
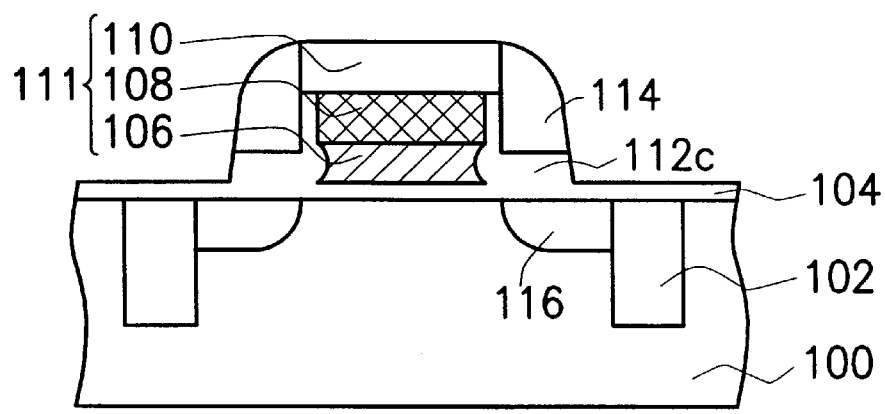
Figure 2A:
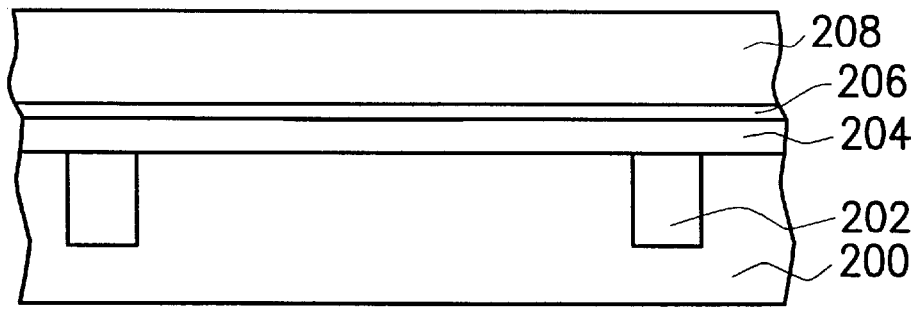
FIGS. 2A through 2F are schematic, cross-sectional diagrams illustrating a fabrication process for a gate structure according to one preferred embodiment of this invention.

Referring to FIG. 2A, a substrate 200 is provided with isolation structures 202, such as shallow trench isolations formed therein. The isolation structures 202 in this case define an active region (not shown) on the substrate 200, on which active region forms a gate structure. A buffer oxide layer 204 is formed on the substrate 200, wherein the buffer oxide layer 204 is preferably made of material such as silicon oxide. The method for forming the buffer oxide layer 204 includes chemical vapor deposition (CVD). A thin mask nitride layer 206, preferably a silicon nitride layer is formed on the buffer oxide layer 204, and a mask oxide layer 208 is then formed on the nitride layer 206, wherein the mask oxide layer 208 is thicker than the nitride layer 206.

Figure 2B:
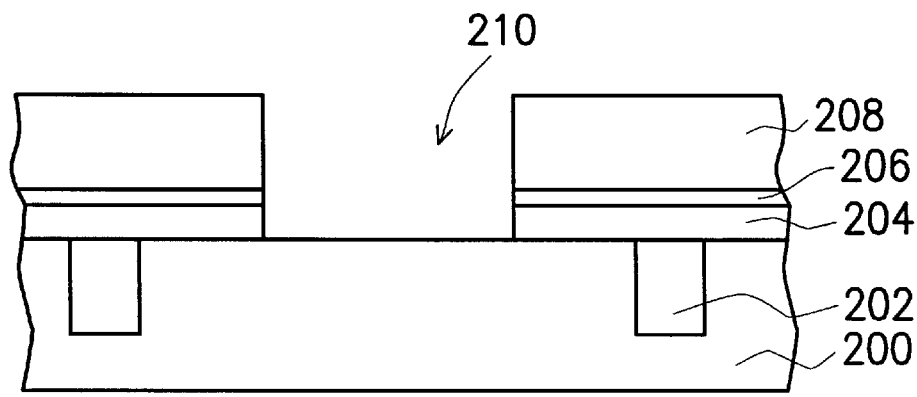

A photolithography and etching is performed to pattern the mask oxide layer 208 and the mask nitride layer 206. As a result, a gate opening 210 delineated by the patterned mask oxide layer 208 and the patterned mask nitride layer 206 is formed to expose a part of the buffer oxide layer 204, as shown in FIG. 2B. The gate opening 210 in this case provides a space where a gate stack is subsequently formed.

Figure 2C:
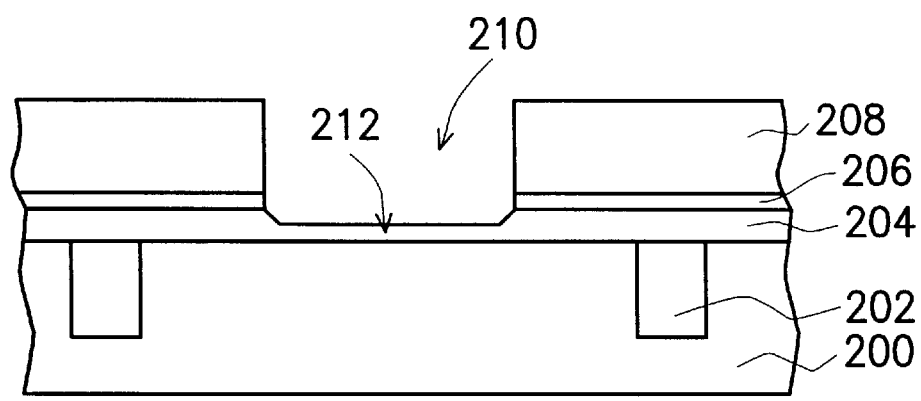

Referring to FIG. 2C, the exposed part of the buffer oxide layer 204 is removed until the substrate 200 in the gate opening 210 is exposed. The method for removing the buffer oxide layer 204 includes an anisotropic etching. A gate oxide layer 212 is then formed on the exposed part of the substrate 200. The gate oxide layer 212 is preferably made of silicon oxide and is formed by thermal oxidation in an oxidation furnace (not shown).

Figure 2D:
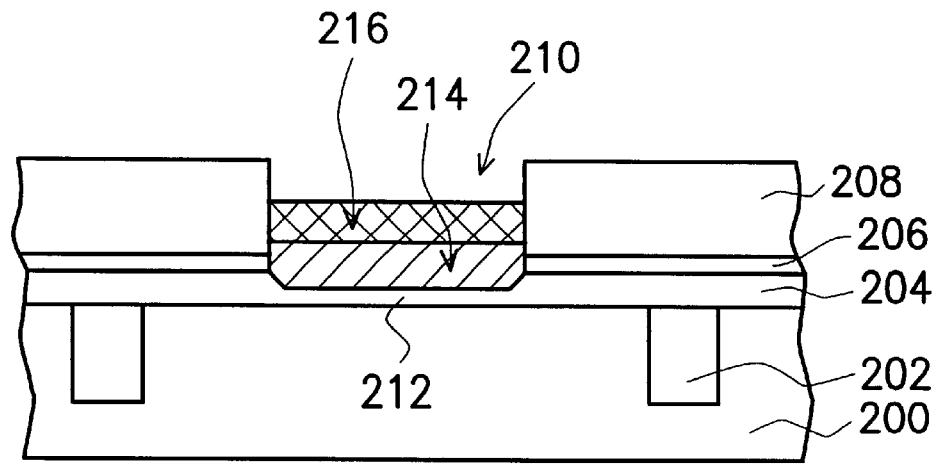

Referring to FIG. 2D, a doped polysilicon layer 214 is formed on the gate oxide layer 212. The method for forming the doped polysilicon layer 214 involves steps, such as depositing the polysilicon layer on the gate oxide layer 212, doping the polysilicon layer with ions for forming the doped polysilicon layer 214, and removing the doped polysilicon layer 214 outside the gate opening 210. Next, a metal silicide layer 216 is formed on the doped polysilicon layer 214. The method for forming the metal silicide layer 216 comprising steps of depositing the metal layer on the doped polysilicon layer 214, performing a thermal process to react the metal layer with the doped polysilicon layer for forming the metal silicide layer 216, and removing the metal silicide layer 216 outside the gate opening 210. Alternatively, the metal silicide layer 216 is substituted by a metal layer, which is preferably formed by metal selective deposition, wherein the metal layer is preferably made of tungsten and titanium. The method for removing the doped polysilicon layer 214 and the metal silicide layer 216 includes an etching back process. The doped polysilicon layer 214 and the metal silicide layer 216 in this case form a conductive component for the gate structure.

Figure 2E:
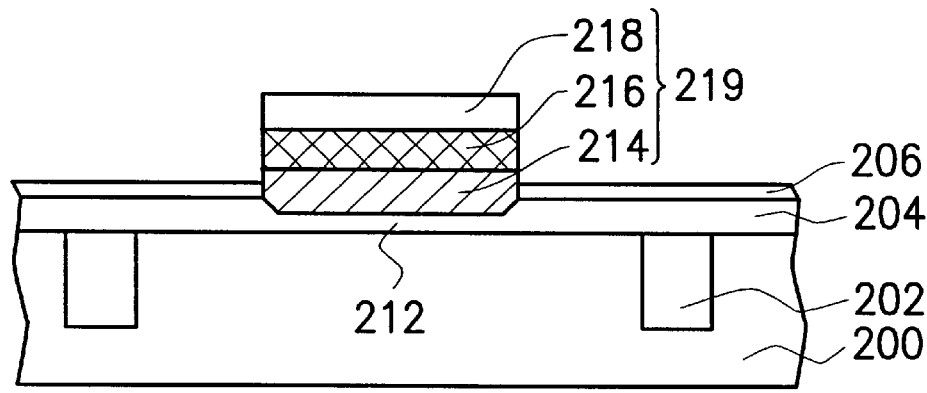

Referring to FIG. 2E, a cap layer 218 is formed on the metal silicide layer 216, wherein the cap layer 218 is preferably made of material, such as silicon nitride. The method for forming the cap layer 218 comprising steps of forming a silicon nitride layer which covers the metal silicide layer 216 and the mask oxide layer 208, removing the silicon nitride layer outside the gate opening 210 by an etching back process. It is noted that the silicon nitride layer can also be removed by performing chemical mechanical polishing (CMP) to obtain a much planar surface for the cap layer 218. The mask oxide layer 208 is then removed until the mask nitride layer 206 is exposed, while the cap layer 218, the metal silicide layer 216, and the doped polysilicon layer 214 are also exposed. As a result, the cap layer 218, the metal silicide layer 216, the doped polysilicon layer, and the gate oxide layer 212 forms a gate stack 219 projecting out on the substrate 200, as shown in FIG. 2E.

Figure 2F:
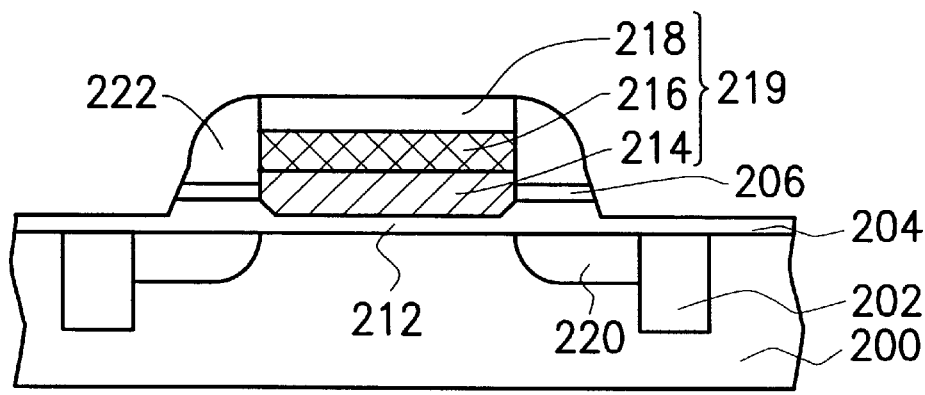

Referring to FIG. 2F, a lightly doped drain (LDD) implantation is performed to form a source/drain region 220 in the substrate 200. A spacer 222 is formed on a sidewall of the gate stack 219, wherein the spacer 222 is preferably made of silicon nitride. The method for forming the spacer 222 includes forming a silicon nitride layer (not shown) on the nitride mask layer 206 to cover the gate stack 219. An etching back process is then performed to remove a part of the silicon nitride layer and a portion of the buffer oxide layer 204 in order to forming the spacer 222. This completes the manufacture of the gate structure, which can be shown in FIG. 2F.

Summarizing from the above, it is understood that the invention is different from most of the conventional fabrication process for MOS transistor in that buffer oxide layer prior to formation of the gate structure. According to the present invention the gate stack is formed after formation of the buffer oxide layer, therefore problems which result from formation of the buffer oxide layer by different oxidation approaches are solved. Specifically, the present invention has advantages and benefits such as, low thermal budget for device implant, since it is not necessary to perform rapid thermal oxidation to grow buffer oxide layer on the gate stack. The invention is also free from sidewall oxidation issue because the gate stack is formed after the formation of the buffer oxide layer, so problems such as oxide encroachment, CD shrinkage, and refresh time deterioration no longer occur. In addition, the invention solves the problem of buffer oxide breakthrough during the etching step for forming a self-aligned contact opening.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a gate structure to reduce a stress production, the method comprising the steps of:

providing a substrate with isolation structures formed therein, wherein the isolation structures define an active region on the substrate;

forming a first oxide layer on the substrate;

forming a mask layer on the first oxide layer;

patterning the mask layer to form a gate opening, which gate opening exposes a part of the first oxide layer;

removing the exposed part of first oxide layer until the substrate is exposed;

forming in sequence a second oxide layer, a conductive layer, and a cap layer on the exposed substrate, wherein the second oxide layer, the conductive layer, and the cap layer form a gate stack having a plurality of sidewalls;

partially removing the mask layer;

performing a lightly doped drain (LDD) implantation to form a source/drain region in the substrate; and forming a spacer on the sidewalls of the gate stack and on the remaining of the mask layer.

2. The fabrication method of claim 1, wherein the step of forming the first oxide layer includes chemical vapor deposition (CVD).

3. The fabrication method of claim 2, wherein the first oxide layer includes a silicon oxide layer.

4. The fabrication method of claim 1, wherein the mask layer comprises a silicon nitride layer and a silicon oxide layer.

5. The fabrication method of claim 1, wherein the method for forming the second oxide layer includes thermal oxidation.

6. The fabrication method of claim 1, wherein the method for forming the conductive layer includes:

depositing the conductive layer on the mask layer for covering the second oxide layer; and removing the conductive layer outside the gate opening.

7. The fabrication method of claim 6, wherein the conductive layer includes a doped polysilicon layer and a metal silicide layer.

8. The fabrication method of claim 7, wherein the method for forming the metal silicide layer includes:

depositing the metal layer on the mask layer for covering the polysilicon layer;

performing a thermal process for forming the metal silicide layer from the metal layer and the doped polysilicon layer; and removing the metal silicide layer outside the gate opening.

9. The fabrication method of claim 8, wherein the metal layer includes a tungsten layer.

10. The fabrication method of claim 8, wherein the metal layer includes a titanium layer.

11. The fabrication method of claim 7, wherein the method for forming the metal silicide layer includes:

depositing the metal silicide layer on the mask layer for covering the polysilicon layer; and removing the metal silicide layer outside the gate opening.

12. The fabrication method of claim 11, wherein the metal silicide layer includes a tungsten silicide layer.

13. The fabrication method of claim 7, wherein the metal silicide layer includes a tungsten layer.

14. The fabrication method of claim 13, wherein the tungsten layer is formed by tungsten selective deposition.

15. The fabrication method of claim 1, wherein the method for forming the cap layer includes:

depositing a silicon nitride layer on the mask layer for covering the conductive layer; and removing the silicon nitride layer outside the gate opening.

16. A method of fabricating a gate structure on an active region of a substrate, which comprises of shallow trench isolations formed therein, the method comprising the steps of:

forming a buffer oxide layer on the substrate;

forming in sequence a patterned nitride layer and a patterned mask oxide layer on the buffer oxide layer, wherein the patterned nitride layer and the patterned mask oxide layer delineate a gate opening which exposes a part of the buffer oxide layer;

removing the exposed part of the buffer oxide layer, so that the substrate in the gate opening is exposed;

forming a gate oxide layer on the exposed part of the substrate;

forming sequentially a doped polysilicon layer, a metal silicide layer, and a cap nitride layer in the gate opening, wherein the doped polysilicon layer, the metal suicide layer, and the cap nitride layer form a gate stack;

removing the patterned mask oxide layer until the patterned nitride layer is exposed; and forming a nitride spacer on a sidewall of the gate stack and on the patterned nitride layer.

17. The fabrication method of claim 16, wherein the step of forming the buffer oxide layer includes CVD.

18. The fabrication method of claim 17, wherein the buffer oxide layer includes a silicon oxide layer.

19. The fabrication method of claim 16, wherein the method for forming the metal silicide layer includes:

depositing the metal layer on the mask oxide layer for covering the polysilicon layer;

performing a thermal process for forming the metal silicide layer from the metal layer and polysilicon layer; and performing an etching process to remove the metal silicide layer outside the gate opening.

20. The fabrication method of claim 19, wherein the metal layer includes a tungsten layer.

21. The fabrication method of claim 19, wherein the metal layer includes a titanium layer.

22. The fabrication method of claim 16, wherein the method for forming the metal silicide layer includes:

depositing the metal silicide layer on the mask oxide layer for covering the polysilicon layer; and performing an etching process to remove the metal silicide layer outside the gate opening.

23. The fabrication method of claim 22, wherein the metal silicide layer includes a tungsten silicide layer.

24. The fabrication method of claim 16, wherein the metal silicide layer includes a tungsten layer.

25. The fabrication method of claim 24, wherein the tungsten layer is formed by tungsten selective deposition.

26. The fabrication method of claim 16, further includes performing a LDD implantation before formation of the nitride spacer to form a source/drain region in the substrate.

27. A method of fabricating a gate structure to reduce a stress production, the method comprising the steps of:

providing a substrate with isolation structures formed therein, wherein the isolation structures define an active region on the substrate;

forming a buffer oxide layer on the substrate;

forming sequentially a nitride layer and a mask oxide layer on the buffer oxide layer;

patterning the nitride layer and mask oxide layer to form a gate opening, which gate opening exposes a part of the buffer oxide layer;

removing the exposed part of the buffer oxide layer until the substrate is exposed;

forming sequentially an oxide layer, a conductive layer and a cap layer on the exposed substrate, wherein the oxide layer, the conductive layer, and the cap layer form a gate stack;

removing the patterned mask oxide layer until the patterned nitride layer is exposed;

performing a lightly doped drain (LDD) implantation to form a source/drain region in the substrate; and forming a nitride spacer on the sidewalls of the gate stack and on the patterned silicon nitride.

* * * * *